United States Patent [19]
Pascucci

[11] Patent Number: 5,777,941
[45] Date of Patent: Jul. 7, 1998

[54] COLUMN MULTIPLEXER

[75] Inventor: Luigi Pascucci, Giovanni, Italy

[73] Assignee: SGS-Thomson Microelectronics S.r.l., Agrate, Italy

[21] Appl. No.: 853,732

[22] Filed: May 9, 1997

[30] Foreign Application Priority Data

May 13, 1996 [EP] European Pat. Off. ............. 96830275

[51] Int. Cl.$^6$ ..................................................... G11C 8/00
[52] U.S. Cl. .................. 365/230.02; 365/189.02; 257/206; 326/102
[58] Field of Search ................. 365/230.02, 189.02; 257/204, 205, 206; 326/101, 102, 41

[56] References Cited

U.S. PATENT DOCUMENTS

| | | | |
|---|---|---|---|
| 4,570,176 | 2/1986 | Kolwicz | 357/42 |
| 4,745,084 | 5/1988 | Rowson et al. | 437/51 |
| 5,051,917 | 9/1991 | Gould et al. | 257/204 |
| 5,369,595 | 11/1994 | Gould et al. | 364/490 |

FOREIGN PATENT DOCUMENTS

| | | | |
|---|---|---|---|
| 0 104 657 A3 | 9/1983 | European Pat. Off. | H01L 27/02 |
| 0 321 738 A3 | 11/1988 | European Pat. Off. | H01L 29/06 |
| 2 187 351 A | 9/1987 | United Kingdom | G11C 11/40 |

*Primary Examiner*—David C. Nelms
*Assistant Examiner*—Son Mai
*Attorney, Agent, or Firm*—Allen, Dyer, Doppelt, Milbrath & Gilchrist, P.A.

[57] ABSTRACT

A column select multiplexer for a memory array organized in modules, each module handling two sets or bunches each of a certain minimum number of bitline, is realized in a space opposite to the bitline terminations and the select transistors are realized along an uninterrupted active area strip by realizing isolation gates between adjacent diffusions of two distinct select transistors. The bitlines of the two bunches handled by a multiplexer module are preferably interleaved and the respective select transistors are realized along two parallel uninterrupted active area strips.

9 Claims, 5 Drawing Sheets

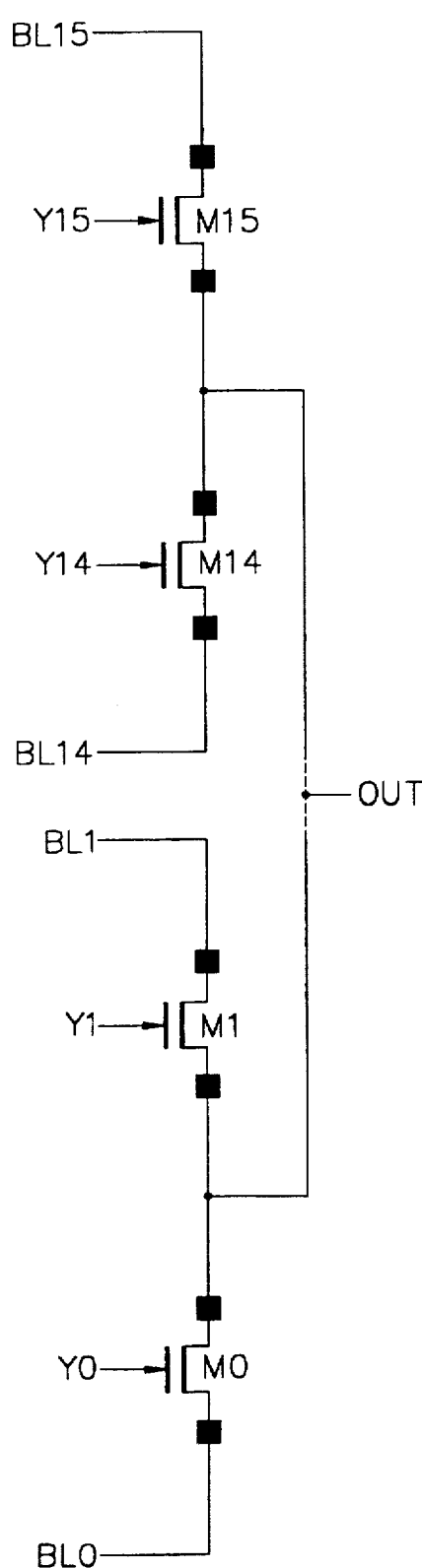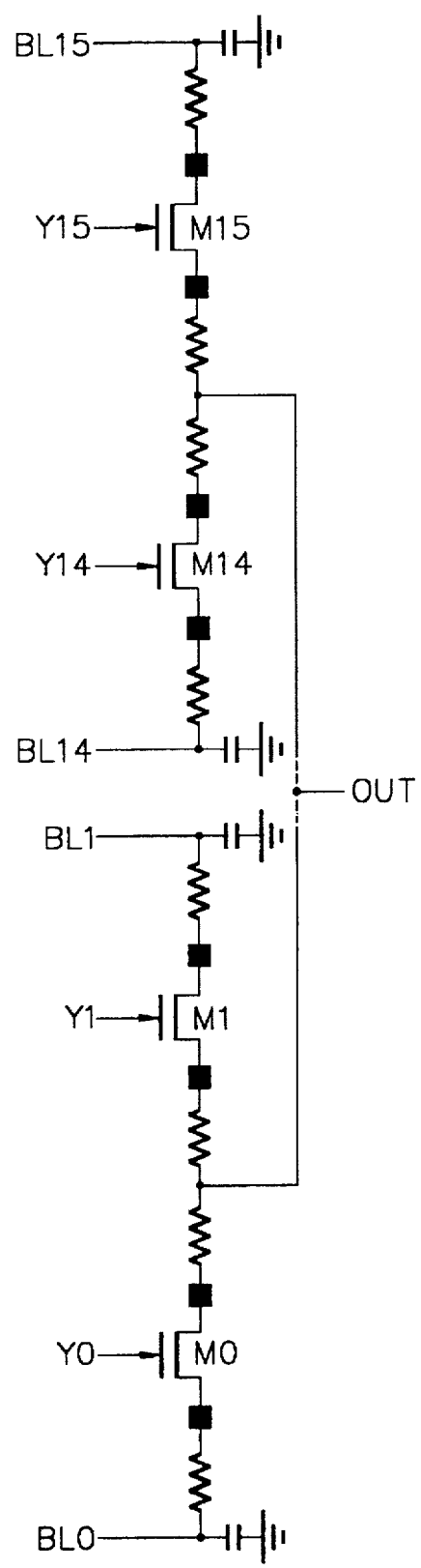
FIG. 1.
(PRIOR ART)
FIG. 2.
(PRIOR ART)

5,777,941

1

COLUMN MULTIPLEXER

FIELD OF THE INVENTION

The present invention relates to high integration EPROM, FLASH-EPROM, ROM and DRAM memories and, more in particular particularly, to an improved architecture of the multiplexer for column selection (COLUMN MUX).

BACKGROUND OF THE INVENTION

The decoding circuitry allows access, during the reading or writing phase, to the cell identified by a certain address fed to the relative inputs of a typical memory. During a reading phase of each bit of the output data (word) corresponds a selected cell. Commonly, upon row selection a row of cells is switched on, whereas, upon column decoding, it is selected which output bit line (column) is coupled to a bit sensing node.

In high integration, state-of-the-art, EPROM, FLASH-EPROM, ROM or DRAM memories and so forth, wherein each elementary cell occupies an area of a few square micrometers, the decoding circuitry represents a critical item of the design, because it must satisfy more and more stringent requisites of compactness, speed and low power consumption. The realization of a column multiplexer in higher and higher scales of integration devices creates difficulties because of the reduced dimensions of the cells. Each new (technological) generation of these devices increases and aggravates these problems. Usually these difficulties imply the following:

area requisite always to the limit of implementation;

accentuation of associated parasitic electrical parameters;

decline of efficiency in terms if reduced multiplexer speed; and inevitable criticality of some structures.

One of the constraints that are most responsible for the above mentioned difficulties in finding the area in which the column multiplexer may be realized is compliance with the minimum isolation distance between adjacent diffusions. In present fabrication processes the minimum isolation distance may be about 1.8 µm. This minimum distance is relatively large if compared to matrix cells dimensions that in this type of processes may be of 1.7 µm by 1.7 µm.

The repetitive electrical scheme of a column multiplexer is depicted in FIG. 1. With reference to the constraints of a fabrication process according to state-of-the-art technology, the minimum distance of separation between two adjacent diffusions of the devices making up the multiplexer (in conformity with the circuit scheme of FIG. 1), may be represented, respectively in a plan view and in a cross-section, as shown in FIGS. 4 and 5. Indicatively, in the plan view of FIG. 4 the minimum distance requisite is highlighted that a contact area must have from the edge of the diffusion, which in this kind of processes may be about 0.2 µm.

On the other hand, the relative compactness of a matrix having a linewidth of just about 1.7 µm compels, for obvious dimensional limitations, to a reduction of the depth of the diffusions and proportionally to an increase of their length in order to ensure a correct functioning of the integrated devices, as well as limiting the frequency (number) of equipotential contacts. This leads to the realization of a particularly resistive and capacitive column multiplexer structure, that is, geometric constraints cause a considerable increment of the "parasitic" electrical parameters associated with the integrated structure of the multiplexer that reduces the efficiency in terms of an increase of the time constants.

2

Moreover, the layout tends to become highly "tortuous" because of the fragmentation of the active areas and burdensome for the accompanying problems that such a tortuous layout raises in realizing the electric paths to the control terminals and their multiplexing, for the sake of equipotentiality.

SUMMARY OF THE INVENTION

Confronted with these drawbacks and constraints, it has now been found, and this is the object of the present invention, a more efficient column multiplexer architecture than the comparable architectures presently used. In practice, the architecture of the invention allows for a decisive relaxation of the minimum isolation distance constraint between adjacent diffusions in designing the layout of a column multiplexer.

Primarily, the invention is based upon the realization of an isolating transistor in place of the inter-diffusion separation space, typical of layouts of known column multiplexers.

Instead, by realizing an isolating transistor, or in practice an isolating gate, shortcircuited to ground, a dimensional saving on the order of 1.05 µm may be attained, considering that the total separating distance between two adjacent contacts used to be about 2.20 µm for the case depicted in FIG. 2.

Considering that the column multiplexing is usually arranged by relatively small modules, that is, by bunches of a relatively small number of bitlines, for example of 16 bitlines (columns) plus a ground line (GND), according to a particularly preferred embodiment of the multiplexer of the invention, the unitary multiplexer structure (module) is realized in the space in front of two bunches, instead of being opposite to a single one, that is, opposite to 16*2 bitlines terminations plus two ground lines. Moreover and preferably, the bitlines relative to two adjacent minimum modules of 16 bitlines each, are interleaved among each other. In this manner, the multiplexer of the invention is, in terms of the layout, realized on two parallel strips, the multiplexing structure of a first minimum module (bunch) of 16 bitlines being realized on a first strip whereas, the multiplexing structure of the other bunch of 16 bitlines is realized as a unit on the other strip, parallel to the first. In this way, the multiplexing structure relative to a single minimum bunch or module of bitlines is realized on the same strip, in a continuous manner, rather than in a typical offset manner due to space limitation, as normally done. These considerations will be illustrated in more details below.

The improved column multiplexer architecture of the invention, besides relieving the above stated geometric constraints, also attains a number of distinguishable advantages that may be summarized as follows:

it allows a beneficial increase of the diffusion areas of the devices that constitute the column multiplexer, thus improving contact to the different regions and a reduction of parasitic resistances;

it permits reduction of the parasitic edge capacitances (reduced length of the boundary towards the field oxide);

continuity of the two active area region remarkably simplifies the layout;

the architecture is unconstrained from traditional geometric limitations and lends itself optimally to a further "scaling" in the future; and relaxation of dimensional constraints also offers the possibility of increasing the size of the transistors that make up the multiplexer and this may constitute an important aspect in improving the memory performances during reading and programming phases.

BRIEF DESCRIPTION OF THE DRAWINGS

FIG. 1, as already mentioned above, is an repetitive electric scheme of a typical column multiplexer as in the prior art;

FIG. 2 highlights the parasitic elements (resistive and capacitive) of the prior art integrated architecture of column multiplexer of FIG. 1, accentuated by existing dimensional constraints;

DETAILED DESCRIPTION OF THE PREFERRED EMBODIMENTS

As shown in FIGS. 1 and 2, the basic or modular electric scheme of a column multiplexer may be described as consisting of a row of select transistors M0, M1, M2, M3, . . . , M14, M15, . . . . Each transistor has its own current terminals connected respectively to a bitline (BL0, BL1, . . . , BL14, BL15, . . . ) and to an output common node OUT of the multiplexer module.

Taking into consideration the integrated structure of the multiplexer circuit, it can be noticed that between two adjacent diffusions, belonging to two distinct transistors of two adjacent pairs, that is, between the coupling nodes of respective current terminals to two adjacent bitlines in a normal memory layout, a certain minimum separating distance must be maintained to ensure an adequate isolation between the two diffusions. During the functioning of the multiplexer, the diffusions may assume quite different potentials (0 and VCC).

Figure 4:
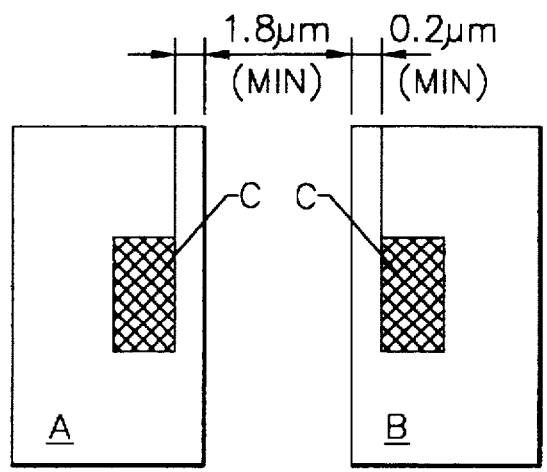
FIGS. 4 and 5, as already mentioned above illustrate on a plan view and on a cross-section, respectively, certain layout restraints between adjacently integrated devices of a column multiplexer according to the prior art scheme shown in FIG. 1.
Figure 5:
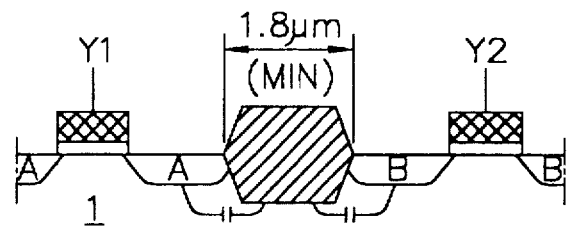

Such constraints of minimum distance of interdiffusion separation are brought to the fore in the plan view of FIG. 4 and in the cross-section of FIG. 5, in which A identifies the diffusion of a transistor and B the diffusion of an adjacent transistor, belonging to a different pair of transistors. In FIG. 4 is also highlighted another dimensional limitation represented by the need of ensuring a minimum distance between the area of a contact C (for the connection to the respective bitline) and the edge of the diffusion. These dimensional constraints contrast with the limited space available because of the compactness (narrowness of the definition line width) of modern memory cell arrays, obliging a reduction of the width of the transistor diffusions and to a proportional elongation thereof to the extent needed to ensure a sufficient diffusion area.

In memories with a high degree of integration, these layout constraints and dimensional compromises have negative repercussions by enhancing parasitic, resistive and capacitive electrical parameters, symbolically pointed out in the electric scheme of FIG. 2.

Figure 3:
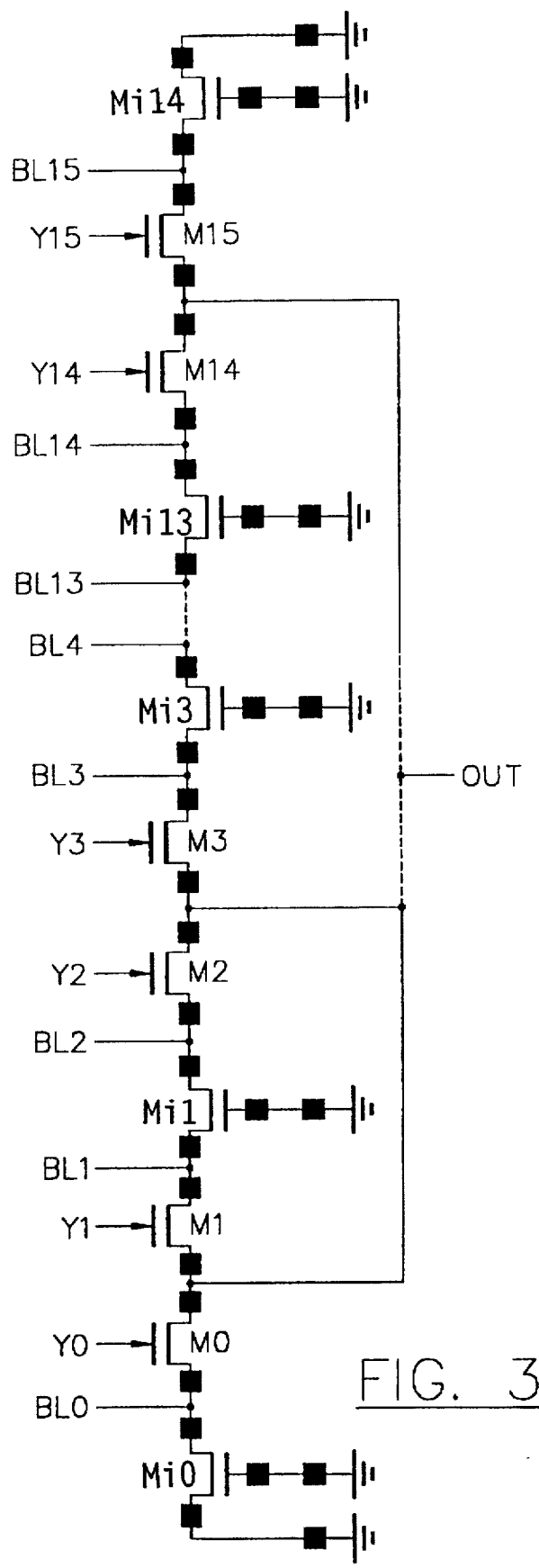
FIG. 3 is a repetitive electric scheme of a module of column multiplexer according to the architecture of this invention.

FIG. 3 shows the circuit diagram of a column multiplexer circuit realized according to the present invention. The diagram depicts a multiplexer module handling 16 bitlines (BL0, BL1, BL2, BL3, . . . , BL14, BL15).

Figure 6:
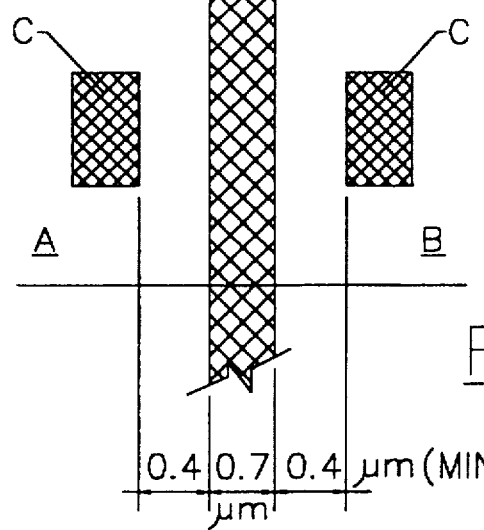
FIGS. 6 and 7 highlight the exceptional relaxation of the dimensional limitations of the present invention, compared to the known architecture of FIGS. 4 and 5.

According to the architecture of the invention, the isolation among the connection nodes of each bitline to the respective select transistor of the multiplexer circuit, is ensured by an isolating transistor, namely (Mi0, Mi1, Mi3, . . . , Mi13, Mi14). The integration manner of the architecture of the invention, comparable with an architecture of the prior art as shown in FIGS. 4 and 5, is depicted in FIGS. 6 and 7, defining a plan view and cross-sectional view, respectively.

Figure 7:
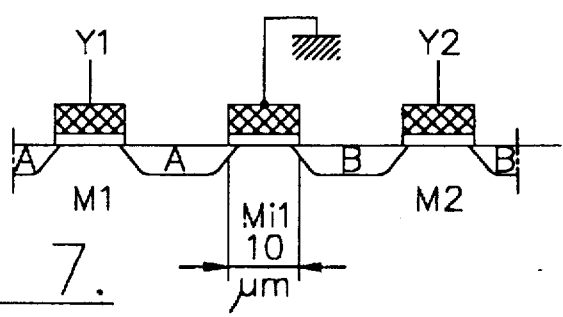

In practice, the column multiplexer circuit of the invention achieves a reduction of more than one micrometer for each isolation point along the width direction as highlighted in the cross-sections of FIGS. 5 and 7. The advantages of the invention will be more evident by comparing a typical layout according to a common arrangement of a column multiplexer as shown in FIG. 8, with a layout realized according to the present invention, as shown in FIG. 9.

In this important example of an embodiment of the invention, the increased compactness provided by the architecture of the invention is exploited, rather than for realizing a savings of silicon area, which, depending on the particular architecture of the memory array, may not be in itself a fundamental requisite, because often column multiplexers are realized in spaces that are made available by the general layout of the architectural blocks that made up the array, but rather for relaxing certain minimum distance requisites. The invention favors a "distributed" contacting with the aim of reducing ohmic contributions to eliminate critical aspects of the process, as well as to produce a more "streamlined" layout, that is less "tortuous".

Figure 8:
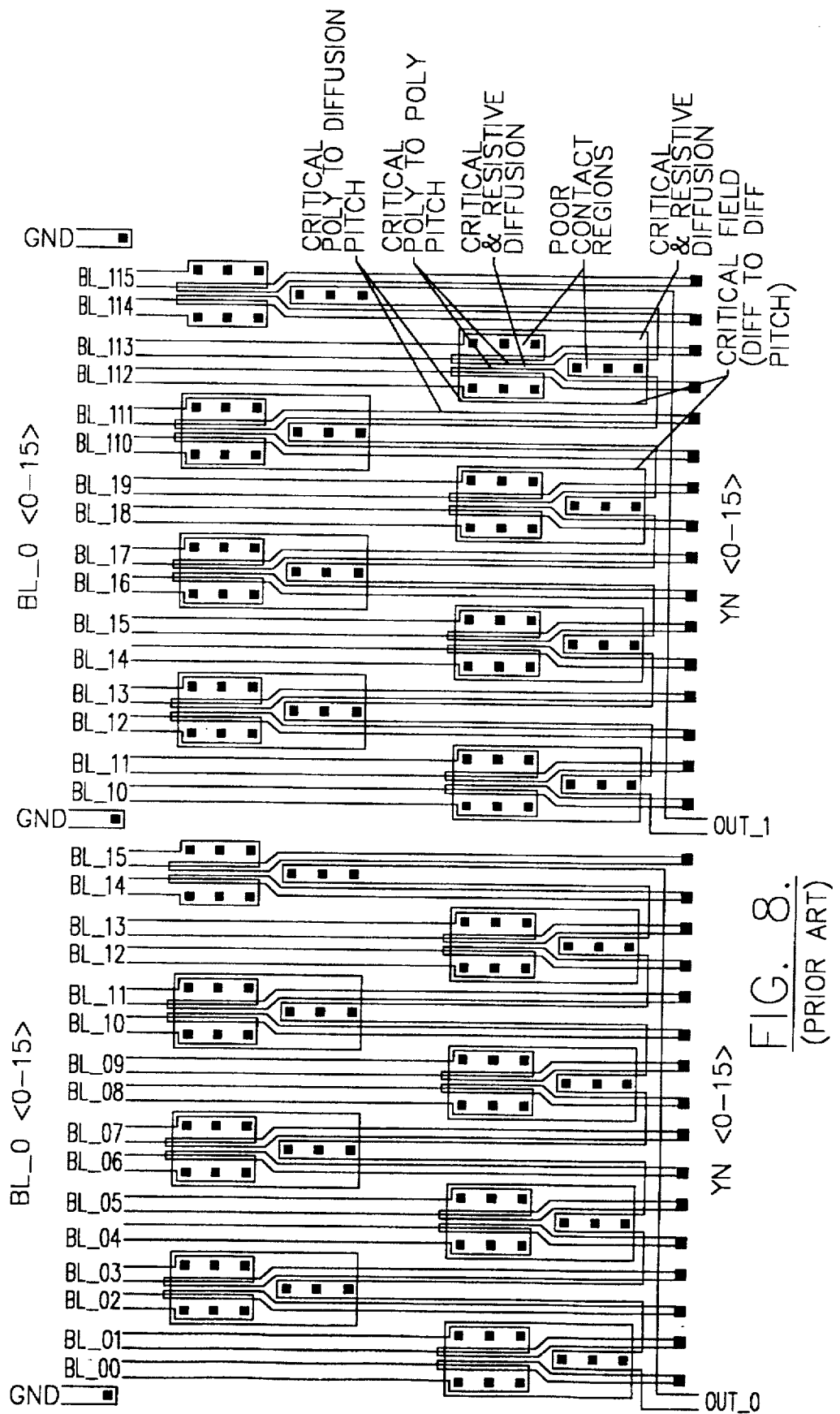
FIGS. 8 and 9 are partial layout views that compare the constraints and critical ties of a known layout with those of a layout of the present invention, respectively.
Figure 9:
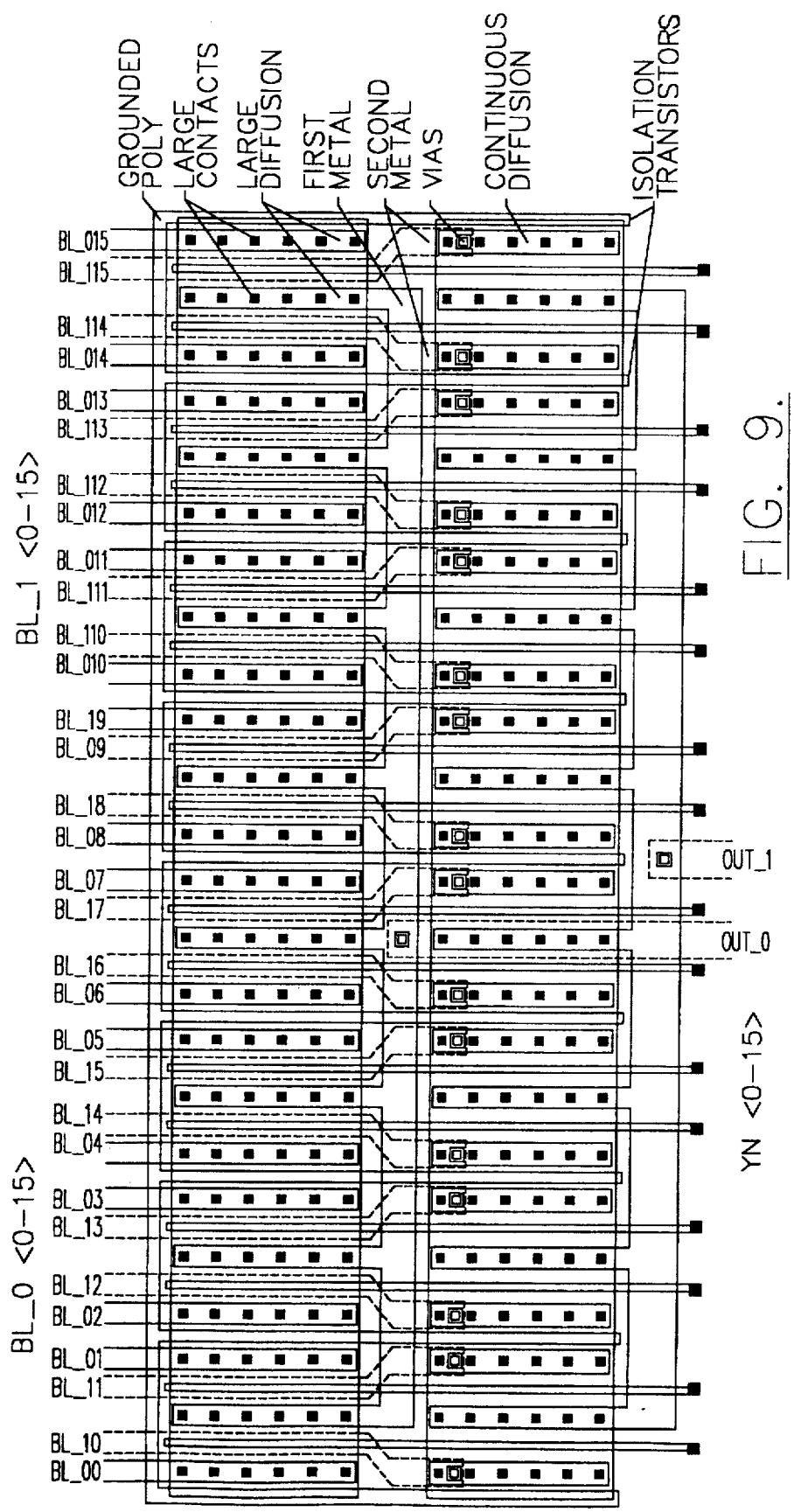

With reference to FIG. 8, where a layout according to current fabrication techniques is shown, the column selection multiplexer for a certain number or bunch of (32) bitlines, BL__0<0–15> and BL__1<0–15>, is organized by forming the necessary 8+8 select transistors in two rows or orders.. This is so because of a general layout constraint, since the minimum "pitch" (distance of separation) between two adjacent select transistors would not be compliant with the bitlines "pitch".

Therefore, alternately by pairs, the bitlines are prolonged through the space between two select transistors of a first or front row or order to the respective select transistors of the second or back row or order of transistors. This arrangement is not free of critical aspects, which are clearly pointed out in FIG. 8. Another feature of this arrangement of the select transistors is the fragmentation in a plurality of diffusion islands, as well as the need to form poly lines (the gate structures of the select transistors) in a relatively tortuous layout in order to create, on alternately either side, the necessary space for realizing the contacts.

FIG. 9 shows a layout according to the present invention which also takes advantage of a second metal level thus allowing an interleaved arrangement of bitlines, as clearly illustrated in this figure.

For the same bunch of 32 bitlines, the layout according to the present invention, allows in the first place to form continuous diffusions, as opposed to the fragmented, ones of the prior art layout and makes possible a much more relaxed spacing.. The layout also allows the realization of straight poly strips, and a contacting that may be distributed in an uniform manner along the respective diffusions to minimize resistances, while reducing also the capacitance toward the body region. These two latter factors decisively contribute to reducing time constants and increasing the speed of the operation of memory.

By referring now to the scheme of FIG. 9, on each row or order are realized alternately a select transistor (select gate) and an isolating transistor (isolating gate), as depicted in the figure by tracing the profile of the bitline BL_0<0–15> with solid lines (second level metal) and that of the bitline BL_1<0–15> with "phantom" lines (first level metal). Therefore, the select transistors of the first 16 bitline BL_0<0–15> are realized along the back row or order (at the top of FIG. 9); being their common output represented by the OUT_0 node, while the select transistors of the second 16 bitlines BL_1<0–15> are realized along the front row or order, being their common output represented by the OUT_1 node.

In order to facilitate comparison with the architecture of FIG. 8, the texts or levels of FIG. 9 single out the advantageous aspects of the architecture of the invention.

I claim:

1. A semiconductor memory device comprising:

an array of memory cells organized in rows and columns respectively addressable through wordlines and bitlines; and a plurality of multiplexer modules for individually selecting memory cells, each multiplexer module for a certain minimum bunch of columns comprising a corresponding number of select transistors, the current terminals of each select transistor being coupled to one of the bitlines and to a common output node, respectively, and an isolating transistor having current terminals respectively coinciding with a coupling node of the current terminal of a first select transistor to a respective first bitline and with a coupling node of a second select transistor, adjacent to said first select transistor, to a respective second bitline and a control terminal for being coupled to a source of a turn-off voltage for said isolating transistor.

2. The device according to claim 1, wherein each multiplexer module is realized in a continuous strip in a space opposite to the terminals of two of said minimum bunches of columns, the respective bitlines of one bunch being interleaved with the respective bitlines of the other bunch, and the two multiplexer modules being realized along two parallel strips.

3. The device according to claim 1, wherein active areas of said first and second adjacent select transistors are contiguous.

4. The device according to claim 3, wherein isolation among respective diffusions of said select transistors formed within the respective contiguous active areas is provided by a channel region topped by a gate structure of said isolating transistor.

5. The device according to claim 1 further comprising two metal levels and in which two minimum bunches of bitlines are interleaved, said select transistors relative to the columns of a first minimum bunch of bitlines being arranged along a first row, alternately to said isolating transistors and said select transistors relative to the columns of the other minimum bunch of bitlines being arranged along a second row, alternately to said isolating transistors, and wherein two orders of mutually interleaved straight strips of polysilicon realize common gate structures of a select transistor of the first order or of a select transistor of the second order and respectively of an isolating transistor of first order or of an isolating transistor of the second order.

6. A semiconductor memory device comprising:

an array of memory cells organized in rows and columns respectively addressable through wordlines and bitlines; and a plurality of multiplexer modules for individually selecting memory cells, each multiplexer module for a certain bunch of columns and being realized in a continuous strip in a space opposite to the terminals of two of said bunches of columns, the respective bitlines of one bunch being interleaved with the respective bitlines of the other bunch, and the two multiplexer modules being realized along two parallel strips, each multiplexer module comprising a plurality of select transistors, the current terminals of each select transistor being coupled to one of the bitlines and to a common output node, respectively, and an isolating transistor having current terminals respectively connected to the current terminal of a first select transistor and to the current terminal of a second select transistor, adjacent to said first select transistor, and a control terminal for being coupled to a source of a turn-off voltage for said isolating transistor.

7. The device according to claim 6, wherein active areas of said first and second adjacent select transistors are contiguous.

8. The device according to claim 7, wherein isolation among respective diffusions of said select transistors formed within the respective contiguous active areas is provided by a channel region topped by a gate structure of said isolating transistor.

9. The device according to claim 6 further comprising two metal levels and in which two bunches of bitlines are interleaved, said select transistors relative to the columns of a first bunch of bitlines being arranged along a first row, alternately to said isolating transistors and said select transistors relative to the columns of the other bunch of bitlines being arranged along a second row, alternately to said isolating transistors, and wherein two orders of mutually interleaved straight strips of polysilicon realize common gate structures of a select transistor of the first order or of a select transistor of the second order and respectively of an isolating transistor of first order or of an isolating transistor of the second order.

* * * * *